US011320864B2

(12) United States Patent
Su et al.

(10) Patent No.: US 11,320,864 B2
(45) Date of Patent: May 3, 2022

(54) FLEXIBLE COVER PLATE, FLEXIBLE DISPLAY APPARATUS, AND FLEXIBLE TERMINAL PRODUCT

(71) Applicant: HUAWEI TECHNOLOGIES CO., LTD., Guangdong (CN)

(72) Inventors: Zhaoliang Su, Dongguan (CN); Wangchun Lyu, Shenzhen (CN); Wenming Shi, Dongguan (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 202 days.

(21) Appl. No.: 16/874,030

(22) Filed: May 14, 2020

(65) Prior Publication Data
US 2020/0272204 A1    Aug. 27, 2020

Related U.S. Application Data

(63) Continuation of application No. PCT/CN2018/095141, filed on Jul. 10, 2018.

(30) Foreign Application Priority Data

Nov. 16, 2017   (CN) .......................... 201721535113.7

(51) Int. Cl.
G06F 1/16      (2006.01)
C09J 7/00      (2018.01)
(Continued)

(52) U.S. Cl.
CPC .............. *G06F 1/1652* (2013.01); *C09J 7/00* (2013.01); *G06F 1/1656* (2013.01); *G09F 9/301* (2013.01);
(Continued)

(58) Field of Classification Search
None
See application file for complete search history.

(56) References Cited

U.S. PATENT DOCUMENTS 6,565,752 B1 *   5/2003  Baron .................... G01N 30/38
                                              210/635
10,020,462 B1 *  7/2018  Ai .......................... H01L 51/524
                        (Continued)

FOREIGN PATENT DOCUMENTS

CN      101598865 A    12/2009
CN      102243409 A    11/2011
                    (Continued)

OTHER PUBLICATIONS

PCT International Search Report and Written Opinion issued in International Application PCT/CN2018/095141 dated Oct. 8, 2018, 15 pages (with English translation).
(Continued)

Primary Examiner — Xanthia C Cunningham
(74) Attorney, Agent, or Firm — Fish & Richardson P.C.

(57) ABSTRACT

A flexible cover plate, a flexible display apparatus, and a flexible terminal product are provided to make the flexible cover plate feature a repeated bending capability and sufficient rigidity. The flexible cover plate includes a first cover-plate layer, a second cover-plate layer, and a flow layer. The flow layer is enclosed between the first cover-plate layer and the second cover-plate layer by using a transparent sealing material. The first cover-plate layer and the second cover-plate layer each have a thickness ranging from 0.05 mm to 0.5 mm, and the flow layer has a thickness ranging from 0.1 mm to 0.2 mm. At least one first support bump is attached to an inner side of the first cover-plate layer, and at least one second support bump is attached to an inner side of the second cover-plate layer.

20 Claims, 4 Drawing Sheets

(51) Int. Cl.
*G09F 9/30* (2006.01)
*H05K 5/00* (2006.01)
*H05K 5/03* (2006.01)
*H05K 5/06* (2006.01)

(52) U.S. Cl.
CPC .............. *H05K 5/0017* (2013.01); *H05K 5/03* (2013.01); *H05K 5/06* (2013.01)

(56) References Cited

U.S. PATENT DOCUMENTS

| | | | |
|---|---|---|---|
| 10,275,069 B2 * | 4/2019 | Smith .................. G06F 3/0447 |
| 11,192,815 B2 * | 12/2021 | Fujii ................... C03B 23/0258 |
| 2012/0256867 A1 * | 10/2012 | Annacone ............... G06F 3/044 |
| | | | 345/174 |
| 2015/0055308 A1 | 2/2015 | Lim et al. |
| 2015/0062460 A1 * | 3/2015 | Yamada ................... H05K 5/03 |
| | | | 349/12 |
| 2017/0068318 A1 * | 3/2017 | McClure ................ G06F 3/016 |
| 2017/0318690 A1 * | 11/2017 | Jung ................... H04M 1/0266 |
| 2018/0024594 A1 * | 1/2018 | Park ..................... G06F 1/1656 |
| | | | 156/60 |
| 2018/0153049 A1 * | 5/2018 | Song ..................... G06F 1/1601 |
| 2018/0267640 A1 * | 9/2018 | Virgili ..................... B32B 27/40 |
| 2018/0374906 A1 * | 12/2018 | Everaerts ............. H01L 27/323 |
| 2019/0072901 A1 * | 3/2019 | Gubelmann ........... G04C 17/00 |
| 2019/0312228 A1 * | 10/2019 | Sonoda ................... H01L 51/56 |
| 2020/0262743 A1 * | 8/2020 | Kim ..................... C03C 23/0075 |

FOREIGN PATENT DOCUMENTS

| | | |
|---|---|---|
| CN | 102566189 A | 7/2012 |
| CN | 102592715 A | 7/2012 |
| CN | 104503181 A | 4/2015 |
| CN | 104779266 A | 7/2015 |
| CN | 106125846 A | 11/2016 |
| CN | 107123371 A | 9/2017 |

OTHER PUBLICATIONS

Extended European Search Report issued in European Application No. 18879188.3 dated Nov. 20, 2020, 8 pages.

* cited by examiner

FLEXIBLE COVER PLATE, FLEXIBLE DISPLAY APPARATUS, AND FLEXIBLE TERMINAL PRODUCT

CROSS-REFERENCE TO RELATED APPLICATIONS

This application is a continuation of International Application No. PCT/CN2018/095141, filed on Jul. 10, 2018, which claims priority to Chinese Patent Application No. 201721535113.7, filed on Nov. 16, 2017. The disclosures of the aforementioned applications are hereby incorporated by reference in their entireties.

TECHNICAL FIELD

The present application relates to the field of display technologies, and in particular, to a flexible cover plate, a flexible display apparatus, and a flexible terminal product.

BACKGROUND

With development of display technologies, screens of intelligent terminal products (such as a mobile phone and a tablet computer) also experience a great change. Using the mobile phone as an example, a screen of the mobile phone develops from a large screen to a small screen, from a straight screen to a curved screen, and to a bezel-less screen and a foldable screen. The foldable screen is an important technical direction for development of the intelligent terminal product in future.

To implement a foldable function of the intelligent terminal product, a display screen is required to feature a repeated bending capability, without affecting a display function of the display screen due to bending. The display screen with the function may be a flexible display screen. However, a surface of an existing flexible module (the flexible module includes the foregoing flexible display screen, where the flexible display screen may also be a display layer) included in the intelligent terminal product has low hardness and weak strength due to a used material. To prolong a service life of the flexible module, it should be avoided that a user directly performs an operation on the flexible module, and therefore a cover plate is required for protection. Therefore, the cover plate also needs to feature sufficient rigidity and the repeated bending capability.

To make the cover plate feature the foregoing capability, a flexible cover plate with the repeated bending capability and sufficient rigidity needs to be developed. A current solution is as follows: A material with good heat resistance and good light transmission is used as a base material of the flexible cover plate, and when a thickness of the material used as the base material can be reduced to a given extent, the flexible cover plate may have the repeated bending capability. For example, a polyimide (PI for short) thin film is used as the base material of the flexible cover plate. A thickness of the PI thin film is less than 0.1 mm, and therefore the PI thin film has a good repeated bending capability. However, as the thickness of the PI thin film is less than 0.1 mm, the PI thin film cannot well protect the flexible module of the intelligent terminal product. In other words, the flexible cover plate does not have sufficient rigidity.

SUMMARY

Embodiments of this application provide a flexible cover plate, a flexible display apparatus, and a flexible terminal product, to make the flexible cover plate feature a repeated bending capability and sufficient rigidity.

A first aspect of this application provides a flexible cover plate, including a first cover-plate layer, a second cover-plate layer, and a flow layer that is enclosed between the first cover-plate layer and the second cover-plate layer by using a transparent sealing material. The flow layer includes fluid capable of flowing, the first cover-plate layer and the second cover-plate layer each have a thickness ranging from 0.05 mm to 0.5 mm, and the flow layer has a thickness ranging from 0.1 mm to 0.2 mm. At least one first support bump is attached to an inner side of the first cover-plate layer, where the first support bump has a height ranging from 0.05 mm to 0.1 mm, and the inner side of the first cover-plate layer is a side that is of the first cover-plate layer and that is in direct contact with the flow layer. At least one second support bump is attached to an inner side of the second cover-plate layer, where the second support bump has a height ranging from 0.05 mm to 0.1 mm, and the inner side of the second cover-plate layer is a side that is of the second cover-plate layer and that is in direct contact with the flow layer.

In the embodiments of this application, the flexible cover plate includes the first cover-plate layer, the second cover-plate layer, and the flow layer. When the flexible cover plate is bent, the fluid in the flow layer that is sealed between the first cover-plate layer and the second cover-plate layer flows toward two sides of the flexible cover plate, to reduce a thickness at a bent part, so that the first cover-plate layer and the second cover-plate layer are bent less and stretched less, thereby avoiding problems such as cracks and deformations that are caused when the first cover-plate layer and the second cover-plate layer are bent. Therefore, the flexible cover plate is enabled with a repeated bending capability. In addition, the flow layer may further have an impact buffer function, to avoid damage to a flexible module of a terminal product to some extent, and increase rigidity of the flexible cover plate. In addition, a first support bump and a second support bump are respectively disposed in an inner side of the first cover-plate layer and an inner side of the second cover-plate layer of the flexible cover plate, and the first support bump and the second support bump can provide a support function, thereby further ensuring overall rigidity of the flexible cover plate.

With reference to the first aspect of the embodiments of this application, in a first implementation of the first aspect of this application, in addition to the fluid capable of flowing, the flow layer may further include a transparent nano-glass material, where a percentage of a filling volume of the transparent nano-glass material to a filling volume of the fluid is from 10% to 50%.

In the embodiments of this application, the transparent nano-glass material that accounts for a specific volume ratio of the filling volume of the fluid is added to the flow layer, so that the flow layer is gel-like. When the flexible cover plate is bent, flow resistance of the fluid in the flow layer is increased to some extent, thereby avoiding problems such as cracks and deformations at a bent part in case of large bending force. In addition, the flow layer can effectively absorb energy, thereby effectively reducing impact against the flexible module.

With reference to the first aspect of the embodiments of this application or the first implementation of the first aspect of the embodiments of this application, in a second implementation of the first aspect of the embodiments of this application, a material of the first cover-plate layer and the second cover-plate layer may be an inorganic material or an organic material. In some implementations of this application, the first cover-plate layer and the second cover-plate layer may include a PI thin film or glass, where the PI thin film or glass is commonly used in a current terminal product.

In the embodiments of this application, several preferred component materials of the first cover-plate layer and the second cover-plate layer are provided, and there are various combinations of materials, with wide selections provided.

With reference to any one of the first aspect of this application, the first implementation of the first aspect of this application, or the second implementation of the first aspect of this application, in a third implementation of the first aspect of this application, when there are at least two first support bumps attached to the inner side of the first cover-plate layer and at least two second support bumps attached to the inner side of the second cover-plate layer, the first support bumps are evenly attached to the inner side of the first cover-plate layer, and the second support bumps are also evenly attached to the inner side of the second cover-plate layer.

In the embodiments of this application, when there are the at least two first support bumps and the at least two second support bumps, the first support bumps and the second support bumps are respectively evenly attached to the inner side of the first cover-plate layer and the inner side of the second cover-plate layer. Therefore, regardless of a part at which the flexible cover plate is bent, the overall rigidity of the flexible cover plate can be ensured maximally.

With reference to any one of the first aspect of this application or the first implementation of the first aspect of this application to the third implementation of the first aspect of this application, in a fourth implementation of the first aspect of this application, the first support bump and the second support bump each may be attached in the following manner: bonding, mold pressing, or coating.

In the embodiments of this application, a plurality of attaching manners of the first support bump and a plurality of attaching manners of the second support bump are provided. This provides diversity in implementations and flexibility.

With reference to any one of the first aspect of this application or the first implementation of the first aspect of this application to the fourth implementation of the first aspect of this application, in a fifth implementation of the first aspect of this application, the first support bump and the second support bump may include transparent resin.

With reference to any one of the first aspect of this application or the first implementation of the first aspect of this application to the fifth implementation of the first aspect of this application, in a sixth implementation of the first aspect of this application, there may be various shapes of the first support bump and various shapes of the second support bump, and the shapes may be different from each other. In some implementations of this application, the first support bump and the second support bump may be in the following shape: a cone, a tetrahedron, a hemisphere, or a cuboid.

In the embodiments of this application, a plurality of shapes of the first support bump and the second support bump are provided, and this is flexible.

With reference to any one of the first aspect of this application or the first implementation of the first aspect of this application to the sixth implementation of the first aspect of this application, in a seventh implementation of the first aspect of this application, the flow layer of the flexible cover plate may include OCA optical adhesive or UV adhesive.

In the embodiments of this application, several fluid materials of the flow layer are provided, and this is flexible and selective.

With reference to any one of the first aspect of this application or the first implementation of the first aspect of this application to the seventh implementation of the first aspect of this application, in an eighth implementation of the first aspect of this application, the transparent sealing material that is used to seal the flow layer between the first cover-plate layer and the second cover-plate layer may include polycarbonate, acrylic, or glass.

In the embodiments of this application, several transparent sealing materials are provided, and this is flexible and selective.

A second aspect of the embodiments of this application provides a flexible display apparatus. The flexible display apparatus includes a flexible cover plate and a display layer. The flexible cover plate is bonded to the display layer, and the flexible cover plate is the flexible cover plate according to any one of the foregoing first aspect of this application, or the first implementation of the foregoing first aspect of this application to the eighth implementation of the foregoing first aspect of this application. It should be noted that in the embodiments of this application, the display layer is a display layer with a touch function, and can implement a function of a touch panel. In some implementations of this application, when the display layer does not have the touch function, the flexible display apparatus may further include a touch panel, and the flexible cover plate, the touch panel, and the display layer are sequentially bonded.

With reference to the second aspect of this application, in a first implementation of the second aspect of this application, the display layer may include an OLED display layer or an LCD display layer.

In the embodiments of this application, several display layers are provided for the flexible display apparatus, and this is flexible and selective.

A third aspect of the embodiments of this application provides a flexible terminal product. The flexible terminal product includes a flexible display apparatus and a foldable mechanism. The flexible display apparatus is bonded to the foldable mechanism. The flexible display apparatus is the flexible display apparatus according to the foregoing second aspect of this application or the first implementation of the foregoing second aspect of this application. The foldable mechanism is foldable and may include a housing, a PCB, a chip, and the like.

According to the foregoing technical solutions, the embodiments of this application have the following advantages.

The flexible cover plate includes the first cover-plate layer, the second cover-plate layer, and the flow layer that is sandwiched between the first cover-plate layer and the second cover-plate layer. The flow layer includes the fluid capable of flowing. When the flexible cover plate is bent, the fluid in the flow layer flows toward the two sides of the flexible cover plate, to reduce the thickness at the bent part, so that the first cover-plate layer and the second cover-plate layer are bent less and stretched less, thereby avoiding the problems such as cracks and deformations that are caused when the first cover-plate layer and the second cover-plate layer are bent. Therefore, the flexible cover plate is enabled with the repeated bending capability. In addition, the flow layer may further have the impact buffer function, thereby avoiding the damage to the flexible module of the terminal product to some extent, and increasing the rigidity of the flexible cover plate. In addition, the first support bump and the second support bump are respectively disposed in the inner side of the first cover-plate layer and the inner side of the second cover-plate layer of the flexible cover plate, and the first support bump and the second support bump can provide the support function, thereby further ensuring the overall rigidity of the flexible cover plate.

DESCRIPTION OF EMBODIMENTS

Embodiments of this application provide a flexible cover plate, a flexible display apparatus, and a flexible terminal product, to make the flexible cover plate feature a repeated bending capability and sufficient rigidity.

Figure 1:
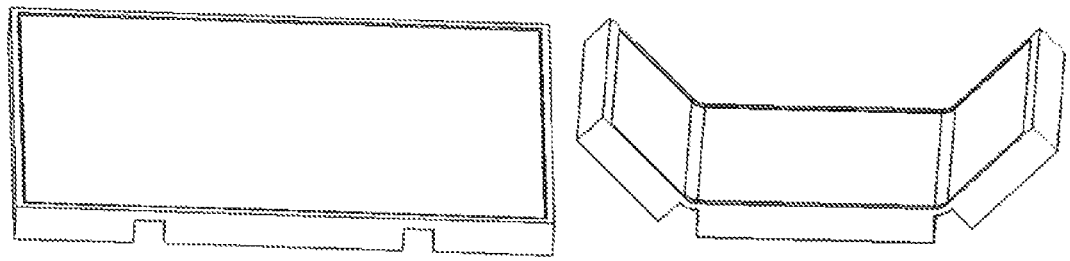
FIG. 1 shows a foldable mobile phone.

Development of display technologies makes a foldable intelligent terminal product possible. FIG. 1 shows a foldable mobile phone. A left side of FIG. 1 is an unfolded state of the mobile phone, and a right side of FIG. 1 is a folded state of the mobile phone.

Figure 2:
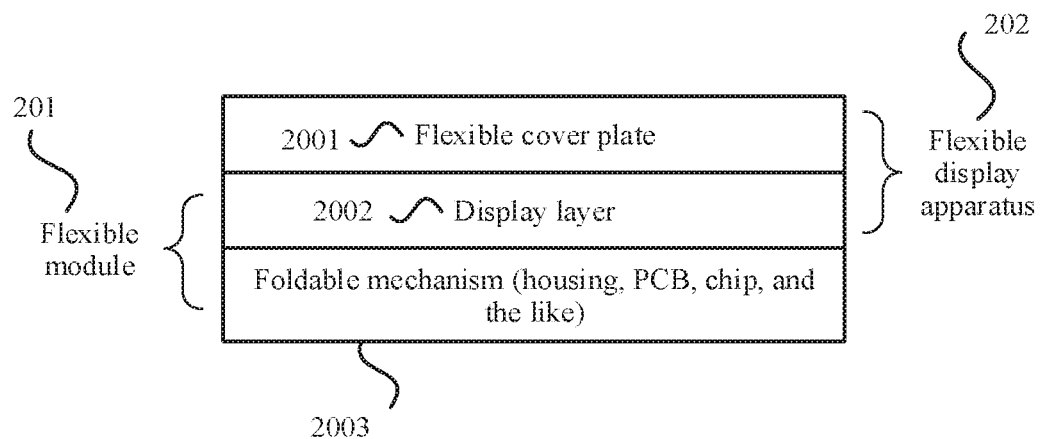
FIG. 2 is a schematic composition diagram of a flexible terminal product according to an embodiment of this application.
Figure 3:
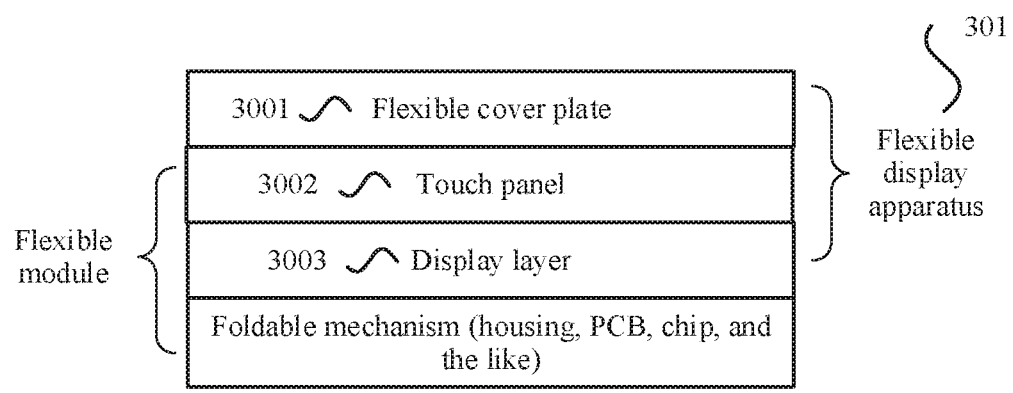
FIG. 3 is another schematic composition diagram of a flexible terminal product according to an embodiment of this application.

In the embodiments of this application, a structure of a foldable flexible terminal product (for example, an electronic device such as a smartphone or a tablet computer) may be divided into two parts as required: a flexible cover plate and a flexible module (that is, a part of an intelligent terminal product other than the flexible cover plate is referred to as the flexible module). Both the flexible cover plate and the flexible module are foldable, so that the entire flexible terminal product is bendable or foldable. As shown in FIG. 2, a flexible module 201 may include a display layer 2002 and a foldable mechanism 2003. The foldable mechanism 2003 may specifically include components (including but not limited to a housing, a PCB, and a chip) that implement all functions of a flexible terminal product. A flexible cover plate 2001 and the display layer 2002 further constitute a flexible display apparatus 202 in this embodiment of this application. The flexible cover plate 2001 and the display layer 2002 are bonded to each other. It should be noted that the display layer 2002 shown in FIG. 2 is a display layer with a touch function, and can implement a function of a touch panel. For example, the touch panel is embedded between a color filter substrate and a polarizer of the display layer by using an on-cell technology or an in-cell technology. If the display layer does not have the touch function, a touch panel is required between the flexible cover plate and the display layer. As shown in FIG. 3, a touch panel 3002 is further sandwiched between a flexible cover plate 3001 and a display layer 3003 without a touch function. The flexible cover plate 3001, the touch panel 3002, and the display layer 3003 are sequentially bonded to each other.

To protect a flexible module of a flexible terminal product, a current common method is to add a flexible cover plate to the flexible module to protect the flexible module. The flexible cover plate needs to feature sufficient rigidity and a repeated bending capability. However, although the current flexible cover plate used in the flexible terminal product has the repeated bending capability, the flexible cover plate is too thin to have sufficient rigidity, incapable of providing sufficient protection for the flexible module of the flexible terminal product. However, if the flexible cover plate is thick enough to provide sufficient protection for the flexible module, the flexible cover plate lacks a bending capability or the repeated bending capability due to an increase in thickness.

To resolve the foregoing problem, this application provides a flexible cover plate, to make the flexible cover plate feature the repeated bending capability, but also has the sufficient rigidity. The following clearly describes the technical solutions in the embodiments of this application with reference to the accompanying drawings in the embodiments of this application. For details, refer to FIG. 4. A flexible cover plate provided in an embodiment of this application includes:

a first cover-plate layer 11, a second cover-plate layer 12, and a flow layer 13.

The flow layer 13 includes fluid capable of flowing. The flow layer 13 is enclosed between the first cover-plate layer 11 and the second cover-plate layer 12 by using a transparent sealing material 14. The transparent sealing material 14 may be polycarbonate, acrylic, or glass, and this is not specifically limited herein. The first cover-plate layer 11 and the second cover-plate layer 12 each have a thickness ranging from 0.05 mm to 0.5 mm, and the flow layer 13 has a thickness ranging from 0.1 mm to 0.2 mm. At least one first support bump 15 is attached to an inner side of the first cover-plate layer 11, where the first support bump 15 has a height ranging from 0.05 mm to 0.1 mm, and the inner side of the first cover-plate layer 11 is a side that is of the first cover-plate layer 11 and that is in direct contact with the flow layer 13. At least one second support bump 16 is attached to an inner side of the second cover-plate layer 12, where the second support bump 16 has a height ranging from 0.05 mm to 0.1 mm, and the inner side of the second cover-plate layer 12 is a side that is of the second cover-plate layer 12 and that is in direct contact with the flow layer 13.

It should be noted that in this embodiment of this application, the first cover-plate layer 11 and the second cover-plate layer 12 each have the thickness that is limited to ranging from 0.05 mm to 0.5 mm, so that the first cover-plate layer 11 and the second cover-plate layer 12 can have a repeated bending capability. If values of the thicknesses are too large, the cover-plate layers are hard to be bent or does not have a bending capability.

Figure 5:
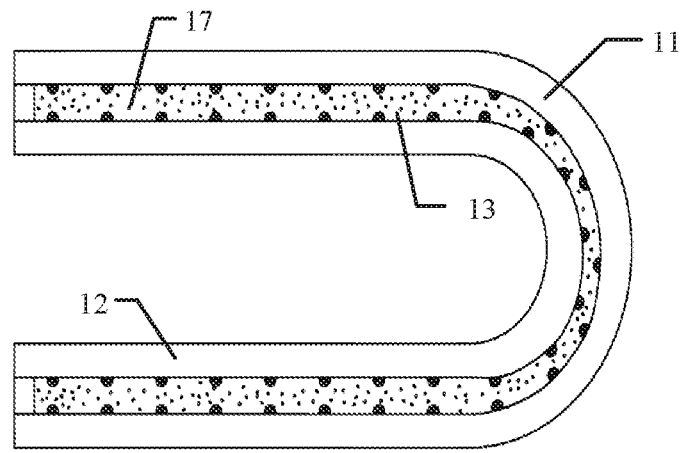
FIG. 5 is a schematic structural diagram when a flexible cover plate is bent at a middle part according to an embodiment of this application.

In this embodiment of this application, the flow layer 13 is configured to enable the flexible cover plate to feature the repeated bending capability, and further increase rigidity of the flexible cover plate. It should be noted that, in addition to the fluid capable of flowing, the flow layer 13 may further include a transparent nano-glass material 17, where a percentage of a filling volume of the transparent nano-glass material to a filling volume of the fluid in the flow layer 13 ranges from 10% to 50%. The transparent nano-glass material that accounts for a specific volume ratio of the filling volume of the fluid is added to the flow layer, so that the flow layer is gel-like. When the flexible cover plate is bent, flow resistance of the fluid in the flow layer is increased to some extent, thereby avoiding problems such as cracks and deformations at a bent part in case of large bending force. In addition, the flow layer can effectively absorb energy, thereby effectively reducing impact against a flexible module. As shown in FIG. 5, when the flexible cover plate is bent from a middle part, the fluid in the flow layer 13 that is sealed between the first cover-plate layer 11 and the second cover-plate layer 12 flows toward two sides of the flexible cover plate (FIG. 5 further shows the transparent nano-glass material 17 in the flow layer 13, and when the flexible cover plate is bent, the transparent nano-glass material 17 also flows toward the two sides of the flexible cover plate), to reduce a thickness at a bent part, so that the first cover-plate layer 11 and the second cover-plate layer 12 are bent less and stretched less, thereby avoiding the problems such as cracks and deformations that are caused when the first cover-plate layer 11 and the second cover-plate layer 12 are bent. Therefore, the flexible cover plate is enabled with the repeated bending capability. In addition, the flow layer 13 may further have an impact buffer function, to avoid damage to a flexible module of a terminal product to some extent, and increase rigidity of the flexible cover plate. When the flexible cover plate is unbent, the fluid in the flow layer 13 flows back from the two sides of the flexible cover plate, so that the flexible cover plate restores to be in a flat state. It should be noted that the fluid in the flow layer 13 of the flexible cover plate may be OCA optical adhesive or UV adhesive. This is not specifically limited herein.

Figure 4:
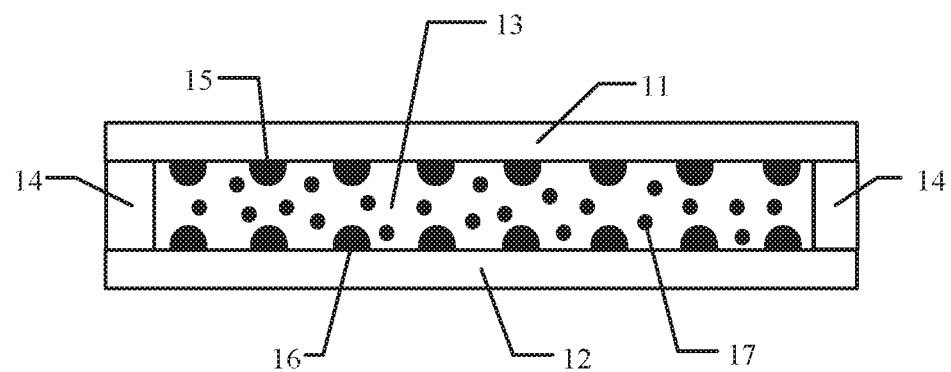
FIG. 4 is a structural diagram of a flexible cover plate according to an embodiment of this application.
Figure 6:
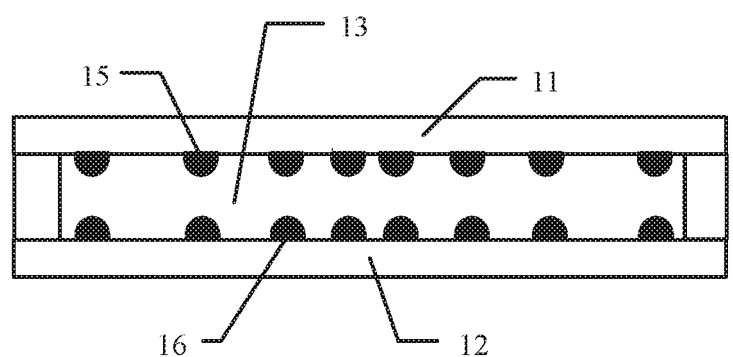
FIG. 6 is another structural diagram of a flexible cover plate according to an embodiment of this application.

It should be further noted that, when there are a plurality of (greater than or equal to 2) first support bumps 15 or second support bumps 16, as shown in FIG. 4, the first support bump 15 and the second support bump 16 may be respectively evenly attached to an inner side of the first cover-plate layer 11 and an inner side of the second cover-plate layer 12. Alternatively, a spacing between the first support bumps 15 and a spacing between the second support bumps 16 may not be specified. The first support bumps 15 and the second support bumps 16 are respectively randomly attached to the inner side of the first cover-plate layer 11 or the inner side of the second cover-plate layer 11. This is not specifically limited herein. Preferably, when attachment spacings between the first support bumps 15 are inconsistent or attachment spacings between the second support bumps 16 are inconsistent, a spacing between the first support bumps 15 or a spacing between the second support bumps 16 at a part at which the flexible cover plate is frequently bent is relatively small, to ensure that the flexible cover plate is not easy to deform at the part at which the flexible cover plate is frequently bent, thereby increasing rigidity. As shown in FIG. 6 (the flow layer 13 in FIG. 6 may include a transparent nano-glass filler, which is not shown in FIG. 6), if the flexible cover plate is frequently bent at a middle part, a spacing between the first support bumps 15 that are close to the middle part of the first cover-plate layer 11 and a spacing between the second support bumps 16 that are close to the middle part of the second cover-plate layer 12 are smaller than spacings at other parts, thereby ensuring rigidity at the frequently bent part.

Figure 7:
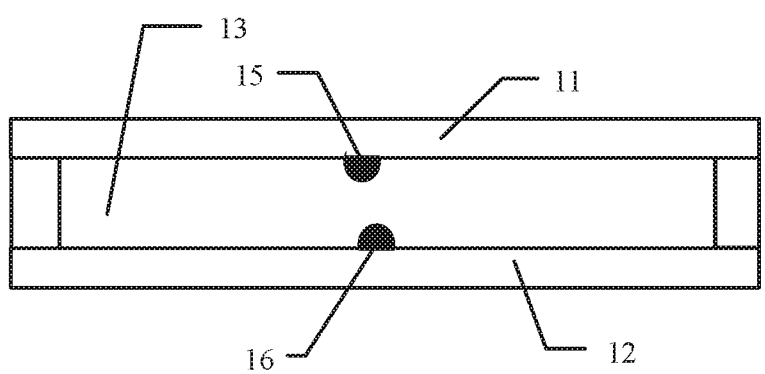
FIG. 7 is another structural diagram of a flexible cover plate according to an embodiment of this application.

It should be further noted that, when there is only one first support bump 15 or only one second support bump 16, the first support bump 15 or the second support bump 16 should also be disposed at a part at which the flexible cover plate is frequently bent. As shown in FIG. 7 (the flow layer 13 in FIG. 7 may include the transparent nano-glass filler, which is not shown in FIG. 7), if the flexible cover plate is frequently bent at a middle part, the first support bump 15 or the second support bump 16 should be disposed at a position that is close to the middle part of the first cover-plate layer 11 or the middle part of the second cover-plate layer 12.

Figure 8:
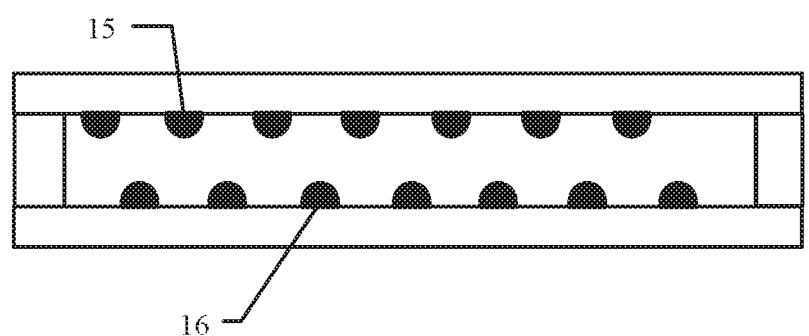
FIG. 8 is another structural diagram of a flexible cover plate according to an embodiment of this application.

It should be further noted that the first support bump 15 and the second support bump 16 may be directly opposite to each other, as shown in FIG. 4: or may be alternately with each other, as shown in FIG. 8. This is not specifically limited herein.

It should be further noted that the first support bump 15 and the second support bump 16 each in FIG. 4 to FIG. 8 are schematically illustrated as a hemisphere shape. In addition to the hemisphere shape, the first support bump 15 and the second support bump 16 each may be alternatively in a shape such as a cone, a tetrahedron, a cuboid, or the like. Specifically, the shapes of the first support bump 15 and the second support bump 16 are not limited herein.

It should be further noted that a material of the first cover-plate layer 11 and the second cover-plate layer 12 may be an inorganic material or an organic material. In some implementations of this application, the first cover-plate layer 11 and the second cover-plate layer 12 may include a PI thin film or glass, where the PI thin film or glass is commonly used in a current terminal product. In this embodiment of this application, if the first cover-plate layer 11 is an outer side that is of the flexible cover plate and that is directly exposed to a user for contact, when base materials of the first cover-plate layer 11 and the second cover-plate layer 12 are PI thin films, a hardened coating layer with a specific thickness needs to be coated on an outer side of the first cover-plate layer 11, to protect the PI thin film from scratches: or when the base materials of the first cover-plate layer 11 and the second cover-plate layer 12 are glass, an anti-fingerprint coating layer with a specific thickness needs to be coated on the outer side of the first cover-plate layer 11, thereby improving abrasion resistance, dirt resistance, and the like of the first cover-plate layer 11.

It should be further noted that the first support bump 15 and the second support bump 16 each may be attached in the following manner: bonding, mold pressing, or coating. This is not specifically limited herein. The first support bump 15 and the second support bump 16 may include transparent resin. This is not specifically limited herein.

An embodiment of this application further provides a flexible display apparatus. As shown in FIG. 2, the flexible display apparatus 202 includes the flexible cover plate 2001 and the display layer 2002, where the flexible cover plate 2001 is bonded to the display layer 2002. The flexible cover plate 2001 is the flexible cover plate according to any one of FIG. 4 to FIG. 8. It should be noted that in this embodiment of this application, the display layer 2002 is a display layer with a touch function, and can implement a function of a touch panel. In some implementations of this application, if the display layer does not have the touch function, the flexible display apparatus may further include a touch panel. As shown in FIG. 3, the flexible display apparatus 301 may include the flexible cover plate 3001, the touch panel 3002, and the display layer 3003, and the flexible cover plate 3001, the touch panel 3002, and the display layer 3003 are sequentially bonded.

It should be noted that in some implementations of this application, the display layer may be an OLED display layer or an LCD display layer. This is not specifically limited herein.

Figure 9:
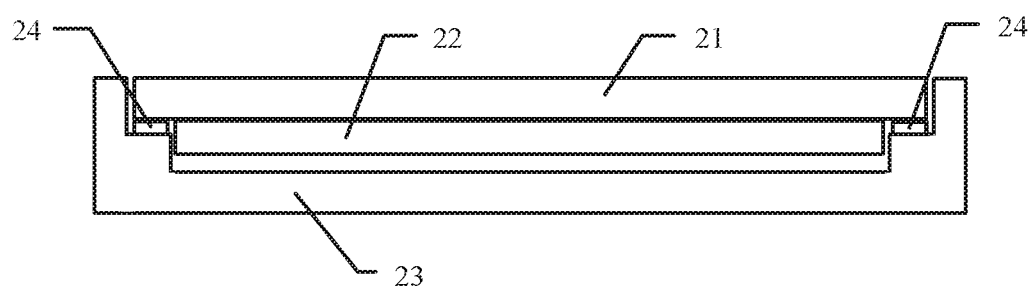
FIG. 9 is a structural diagram of a flexible terminal product according to an embodiment of this application.

An embodiment of this application further provides a flexible terminal product. As shown in FIG. 9, the flexible terminal product includes a flexible display apparatus and a foldable mechanism 23, where the flexible display apparatus includes a flexible cover plate 21 and a display layer 22. The display layer 22 of the flexible display apparatus is bonded to the foldable mechanism 23 by using adhesive 24. The flexible display apparatus is the foregoing flexible display apparatus that includes the flexible cover plate according to any one of FIG. 4 to FIG. 8. The foldable mechanism 23 is foldable and may include a housing, a PCB, a chip, and the like. It should be noted that a structural diagram of the flexible terminal product shown in FIG. 9 is merely an example. This is not specifically limited herein.

The foregoing embodiments are merely intended to describe the technical solutions of this application, but not to limit this application. Although this application is described in detail with reference to the foregoing embodiments, persons of ordinary skill in the art should understand that they may still make modifications to the technical solutions described in the foregoing embodiments or make equivalent replacements to some technical features thereof, without departing from the spirit and scope of the technical solutions of the embodiments of this application.

What is claimed is:

1. A flexible cover plate, comprising:
   a first cover-plate layer, a second cover-plate layer, and a flow layer, wherein:
   the flow layer comprises fluid capable of flowing, wherein the flow layer is enclosed between the first cover-plate layer and the second cover-plate layer by using a transparent sealing material, wherein the first cover-plate layer and the second cover-plate layer each have a thickness ranging from 0.05 mm to 0.5 mm, and wherein the flow layer has a thickness ranging from 0.1 mm to 0.2 mm;
   at least one first support bump is attached to an inner side of the first cover-plate layer, wherein the at least one first support bump has a height ranging from 0.05 mm to 0.1 mm, and wherein the inner side of the first cover-plate layer is a side that is of the first cover-plate layer and that is in direct contact with the flow layer; and
   at least one second support bump is attached to an inner side of the second cover-plate layer, wherein the at least one second support bump has a height ranging from 0.05 mm to 0.1 mm, and wherein the inner side of the second cover-plate layer is a side that is of the second cover-plate layer and that is in direct contact with the flow layer.

2. The flexible cover plate according to claim 1, wherein the flow layer further comprises:
   a transparent nano-glass material, wherein a percentage of a filling volume of the transparent nano-glass material to a filling volume of the fluid ranges from 10% to 50%.

3. The flexible cover plate according to claim 2, wherein the first cover-plate layer and the second cover-plate layer comprise a polyimide (PI) thin film or glass.

4. The flexible cover plate according to claim 1, wherein when there are at least two first support bumps and at least two second support bumps, the at least two first support bumps are evenly attached to the inner side of the first cover-plate layer, and the at least two second support bumps are evenly attached to the inner side of the second cover-plate layer.

5. The flexible cover plate according to claim 1, wherein the at least one first support bump and the at least one second support bump each are attached in the following manner: bonding, mold pressing, or coating.

6. The flexible cover plate according to claim 1, wherein the at least one first support bump and the at least one second support bump each comprise transparent resin.

7. The flexible cover plate according to claim 1, wherein the at least one first support bump and the at least one second support bump each are in the following shape: a cone, a tetrahedron, a hemisphere, or a cuboid.

8. The flexible cover plate according to claim 1, wherein the fluid comprises optically clear adhesive (OCA) optical adhesive or ultraviolet (UV) adhesive.

9. The flexible cover plate according to claim 1, wherein the transparent sealing material comprises polycarbonate, acrylic, or glass.

10. A flexible display apparatus, comprising:
    a flexible cover plate and a display layer, wherein the flexible cover plate is bonded to the display layer, and wherein the flexible cover plate comprises:
    a first cover-plate layer, a second cover-plate layer, and a flow layer, wherein:
    the flow layer comprises fluid capable of flowing, wherein the flow layer is enclosed between the first cover-plate layer and the second cover-plate layer by using a transparent sealing material, wherein the first cover-plate layer and the second cover-plate layer each have a thickness ranging from 0.05 mm to 0.5 mm, and wherein the flow layer has a thickness ranging from 0.1 mm to 0.2 mm;
    at least one first support bump is attached to an inner side of the first cover-plate layer, wherein the at least one first support bump has a height ranging from 0.05 mm to 0.1 mm, and wherein the inner side of the first cover-plate layer is a side that is of the first cover-plate layer and that is in direct contact with the flow layer; and
    at least one second support bump is attached to an inner side of the second cover-plate layer, wherein the at least one second support bump has a height ranging from 0.05 mm to 0.1 mm, and wherein the inner side of the second cover-plate layer is a side that is of the second cover-plate layer and that is in direct contact with the flow layer.

11. The flexible display apparatus according to claim 10, wherein the flow layer further comprises:
    a transparent nano-glass material, wherein a percentage of a filling volume of the transparent nano-glass material to a filling volume of the fluid ranges from 10% to 50%.

12. The flexible display apparatus according to claim 10, wherein
    when there are at least two first support bumps and at least two second support bumps, the at least two first support bumps are evenly attached to the inner side of the first cover-plate layer, and the at least two second support bumps are evenly attached to the inner side of the second cover-plate layer.

13. The flexible display apparatus according to claim 10, wherein the at least one first support bump and the at least one second support bump each comprise transparent resin.

14. The flexible display apparatus according to claim 10, wherein the at least one first support bump and the at least one second support bump each are in the following shape: a cone, a tetrahedron, a hemisphere, or a cuboid.

15. The flexible display apparatus according to claim 10, wherein the fluid comprises optically clear adhesive (OCA) optical adhesive or ultraviolet (UV) adhesive.

16. A flexible terminal product, comprising:
a flexible display apparatus and a foldable mechanism, wherein the flexible display apparatus is bonded to the foldable mechanism, wherein the foldable mechanism has a foldable function, and wherein the foldable mechanism comprises a housing, a printed circuit board (PCB) and a chip;
wherein the flexible display apparatus comprises: a flexible cover plate and a display layer;
wherein the flexible cover plate is bonded to the display layer, and wherein the flexible cover plate comprises:
  a first cover-plate layer, a second cover-plate layer, and a flow layer, wherein:
    the flow layer comprises fluid capable of flowing, wherein the flow layer is enclosed between the first cover-plate layer and the second cover-plate layer by using a transparent sealing material, wherein the first cover-plate layer and the second cover-plate layer each have a thickness ranging from 0.05 mm to 0.5 mm, and wherein the flow layer has a thickness ranging from 0.1 mm to 0.2 mm;
    at least one first support bump is attached to an inner side of the first cover-plate layer, wherein the at least one first support bump has a height ranging from 0.05 mm to 0.1 mm, and wherein the inner side of the first cover-plate layer is a side that is of the first cover-plate layer and that is in direct contact with the flow layer; and
    at least one second support bump is attached to an inner side of the second cover-plate layer, wherein the at least one second support bump has a height ranging from 0.05 mm to 0.1 mm, and wherein the inner side of the second cover-plate layer is a side that is of the second cover-plate layer and that is in direct contact with the flow layer.

17. The flexible terminal product according to claim 16, wherein the flow layer further comprises:
  a transparent nano-glass material, wherein a percentage of a filling volume of the transparent nano-glass material to a filling volume of the fluid ranges from 10% to 50%.

18. The flexible terminal product according to claim 16, wherein
  when there are at least two first support bumps and at least two second support bumps, the at least two first support bumps are evenly attached to the inner side of the first cover-plate layer, and the at least two second support bumps are evenly attached to the inner side of the second cover-plate layer.

19. The flexible terminal product according to claim 16, wherein the at least one first support bump and the at least one second support bump each comprise transparent resin.

20. The flexible terminal product according to claim 16, wherein the fluid comprises optical clear adhesive (OCA) optical adhesive or ultraviolet (UV) adhesive.

\* \* \* \* \*

UNITED STATES PATENT AND TRADEMARK OFFICE
CERTIFICATE OF CORRECTION

PATENT NO. : 11,320,864 B2  
APPLICATION NO. : 16/874030  
DATED : May 3, 2022  
INVENTOR(S) : Zhaoliang Su, Wangchun Lyu and Wenming Shi Page 1 of 1

It is certified that error appears in the above-identified patent and that said Letters Patent is hereby corrected as shown below:

In the Claims

Column 11/Line 7 - In Claim 16, delete "(PCB)" and insert -- (PCB), --.

Signed and Sealed this  
Fourth Day of October, 2022

Katherine Kelly Vidal  
*Director of the United States Patent and Trademark Office*